(12) United States Patent
Lee et al.

(10) Patent No.: US 10,797,095 B2
(45) Date of Patent: *Oct. 6, 2020

(54) IMAGE SENSORS AND METHODS OF FORMING THE SAME

(71) Applicant: Samsung Electronics Co., Ltd., Suwon-si, Gyeonggi-do (KR)

(72) Inventors: Yun Ki Lee, Hwaseong-si (KR); Minwook Jung, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/570,142

(22) Filed: Sep. 13, 2019

(65) Prior Publication Data

US 2020/0013809 A1    Jan. 9, 2020

Related U.S. Application Data

(60) Continuation of application No. 16/026,265, filed on Jul. 3, 2018, now Pat. No. 10,418,403, which is a division of application No. 14/994,230, filed on Jan. 13, 2016, now Pat. No. 10,032,819.

(30) Foreign Application Priority Data

Jan. 13, 2015 (KR) .................. 10-2015-0006012

(51) Int. Cl.
*H01L 27/146* (2006.01)
*H01L 29/06* (2006.01)

(52) U.S. Cl.
CPC ...... *H01L 27/1463* (2013.01); *H01L 27/1464* (2013.01); *H01L 29/0649* (2013.01); *H01L 27/14621* (2013.01); *H01L 27/14627* (2013.01)

(58) Field of Classification Search
CPC .......... H01L 27/1463; H01L 27/14621; H01L 27/1464; H01L 29/0649; H01L 33/02164
See application file for complete search history.

(56) References Cited

U.S. PATENT DOCUMENTS

| 8,119,439 | B2 | 2/2012 | Park |
| 8,378,440 | B2 * | 2/2013 | Kwon ............... H01L 27/14621 257/432 |
| 8,610,227 | B2 | 12/2013 | Chou et al. |
| 8,674,283 | B2 | 3/2014 | Roy et al. |
| 8,779,539 | B2 | 7/2014 | Kao et al. |
| 8,853,811 | B2 | 10/2014 | Lai et al. |
| 9,293,490 | B2 | 3/2016 | Chien et al. |
| 9,443,892 | B2 | 9/2016 | Koo et al. |

(Continued)

FOREIGN PATENT DOCUMENTS

| KR | 10-0760137 B1 | 9/2007 |
| KR | 20070118391 A | 12/2007 |

*Primary Examiner* — Joseph C. Nicely
(74) *Attorney, Agent, or Firm* — Harness, Dickey & Pierce, P.L.C.

(57) ABSTRACT

An image sensor includes a substrate including a plurality of pixel regions and having a trench between the pixel regions, a photoelectric conversion part in the substrate of each of the pixel regions, and a device isolation pattern in the trench. The device isolation pattern defines an air gap. The device isolation pattern has an intermediate portion and an upper portion narrower than the intermediate portion.

20 Claims, 13 Drawing Sheets

(56) References Cited

U.S. PATENT DOCUMENTS

| | | | |
|---|---|---|---|
| 10,032,819 B2* | 7/2018 | Lee | H01L 29/0649 |
| 2010/0006969 A1* | 1/2010 | Park | H01L 27/14621 |
| | | | 257/446 |
| 2010/0253819 A1* | 10/2010 | Yokozawa | H01L 27/14605 |
| | | | 348/273 |
| 2011/0186918 A1 | 8/2011 | Sung | |
| 2012/0153128 A1 | 6/2012 | Roy et al. | |
| 2012/0188397 A1* | 7/2012 | Ohta | H01L 27/14641 |
| | | | 348/222.1 |
| 2012/0217605 A1 | 8/2012 | Kunikiyo | |
| 2013/0285181 A1 | 10/2013 | Lin et al. | |
| 2013/0323875 A1 | 12/2013 | Park et al. | |
| 2014/0054662 A1* | 2/2014 | Yanagita | H01L 27/14612 |
| | | | 257/291 |
| 2014/0077323 A1 | 3/2014 | Velichko et al. | |
| 2014/0078310 A1 | 3/2014 | Velichko et al. | |
| 2014/0117459 A1 | 5/2014 | Kim et al. | |
| 2014/0239362 A1* | 8/2014 | Koo | H01L 27/1464 |
| | | | 257/294 |
| 2014/0361355 A1 | 12/2014 | Shin et al. | |
| 2015/0076643 A1* | 3/2015 | Kikuchi | H01L 27/14685 |
| | | | 257/432 |
| 2015/0102448 A1* | 4/2015 | Sato | H01L 27/1469 |
| | | | 257/446 |
| 2015/0243694 A1* | 8/2015 | Ihara | H01L 27/14638 |
| | | | 257/443 |
| 2015/0263054 A1 | 9/2015 | Chien et al. | |
| 2015/0279883 A1* | 10/2015 | Manouvrier | H01L 27/1463 |
| | | | 257/225 |
| 2015/0318319 A1* | 11/2015 | Peng | H01L 27/1463 |
| | | | 257/292 |
| 2016/0027822 A1* | 1/2016 | Ooka | H01L 27/14629 |
| | | | 257/432 |
| 2016/0086985 A1 | 3/2016 | Chung et al. | |
| 2016/0211288 A1 | 7/2016 | Yanagita et al. | |
| 2016/0284746 A1 | 9/2016 | Fukase et al. | |
| 2017/0098671 A1 | 4/2017 | Shinohara | |
| 2017/0133429 A1 | 5/2017 | Cheng et al. | |
| 2017/0170217 A1 | 6/2017 | Yanagita et al. | |
| 2017/0317119 A1 | 11/2017 | Shinohara | |

* cited by examiner

IMAGE SENSORS AND METHODS OF FORMING THE SAME

CROSS-REFERENCE TO RELATED APPLICATION

This application is a Continuation application of U.S. application Ser. No. 16/026,265, filed Jul. 3, 2018, which is a Divisional application of U.S. application Ser. No. 14/994,230, filed Jan. 13, 2016, which claims priority under 35 U.S.C. § 119 to Korean Patent Application No. 10-2015-0006012, filed on Jan. 13, 2015, in the Korean Intellectual Property Office, the entire contents of each of which are incorporated herein by reference.

BACKGROUND

1. Field

Some example embodiments of the inventive concepts relate to image sensors including device isolation patterns and/or methods of forming the same.

2. Description of the Related Art

An image sensor is a semiconductor device that converts an optical image into electrical signals. Image sensors may be categorized as any one of charge coupled device (CCD)-type image sensors and complementary metal-oxide-semiconductor (CMOS)-type image sensors. CIS is short for the CMOS-type image sensor. The CIS may include a plurality of pixels two-dimensionally arranged, and each of the pixels may include a photodiode (PD). The photodiode may convert incident light into an electrical signal.

As semiconductor devices have been highly integrated, image sensors have also been highly integrated. Sizes of pixels have been reduced by the high integration density of the image sensor, so crosstalk may occur between the pixels.

SUMMARY

Some example embodiments of the inventive concepts may provide image sensors capable of reducing or minimizing crosstalk between pixels and methods of forming the same.

According to an example embodiment, an image sensor includes a substrate including a plurality of pixel regions and having a trench between the pixel regions, a photoelectric conversion part in each of the pixel regions, and a device isolation pattern in the trench. The device isolation pattern defines an air gap. An upper portion of the device isolation pattern is narrower than an intermediate portion of the device isolation pattern.

In an example embodiment, the device isolation pattern may further include an insulating layer on a first surface of the substrate. An upper portion of the trench may be delimited by the insulating layer.

In an example embodiment, the insulating layer may extend along a bottom surface and sidewalls of the trench.

In an example embodiment, a top surface of the insulating layer on the bottom surface of the trench may be spaced apart from a bottom surface of the insulating layer delimiting the upper portion of the trench.

In an example embodiment, a thickness of the insulating layer on the first surface of the substrate may be equal to that of the insulating layer on the bottom surface and the sidewalls of the trench.

In an example embodiment, a width of a bottom portion of the device isolation pattern may be narrower than a width of the intermediate portion of the device isolation pattern.

In an example embodiment, sidewalls of the device isolation pattern may be coplanar with sidewalls of the trench.

According to another example embodiment, an image sensor includes a substrate including a plurality of pixel regions, a device isolation pattern in the substrate and on a first surface of the substrate to define the pixel regions, and a photoelectric conversion part provided in each of the pixel regions. The device isolation pattern defines an air gap. An upper portion of the device isolation pattern is adjacent to the first surface of the substrate, and the upper portion of the device isolation pattern has an increasing width at an increasing distance from the first surface of the substrate.

In another example embodiment, the device isolation pattern may further include an insulating layer covering the first surface of the substrate. The upper portion of the device isolation pattern may be delimited by the insulating layer.

In another example embodiment, the insulating layer may also extend along sidewalls and a bottom surface of the device isolation pattern.

In another example embodiment, a refractive index of the insulating layer may be lower than that of the substrate and may be higher than that of the air gap.

In another example embodiment, a lower portion of the device isolation pattern may have a decreasing width at a decreasing distance from a bottom surface of the device isolation pattern.

In another example embodiment, the image sensor may further include color filters on the first surface of the substrate, a transfer gate in each of the pixel regions on a second surface of the substrate, and an interconnection structure on the second surface of the substrate to cover the transfer gate in each of the pixel regions.

According to still another example embodiment, a method of forming an image sensor includes forming a trench in a substrate, and forming an insulating layer on a first surface of the substrate delimiting the upper portion of the trench to form a device isolation pattern defining an air gap. An upper portion of the trench is narrower than an intermediate portion of the trench, and the device isolation pattern defines pixel regions in the substrate.

In still another example embodiment, forming the trench may include forming a mask pattern having an opening with a first width on the first surface of the substrate, and etching the substrate exposed by the mask pattern. The upper portion of the trench may have a width equal to or greater than the first width.

In still another example embodiment, etching the substrate may include isotropically etching the substrate using an etching gas containing fluorine.

In still another example embodiment, the trench may extend under the mask pattern in the substrate.

In still another example embodiment, the upper portion of the trench may have an increasing width at an increasing distance from the first surface of the substrate.

In still another example embodiment, the insulating layer may conformally cover the first surface of the substrate, a bottom surface of the trench, and sidewalls of the trench.

In still another example embodiment, the method may further include forming photoelectric conversion parts in pixel regions of the substrate.

According to yet another example embodiment, an image sensor includes a substrate including pixel regions having a trench there between, and an insulating pattern in the trench. The insulating pattern includes an insulating layer on a first surface of the substrate and conformally formed to surround an air gap. The insulating layer has a first refractive index and a first volume, the air gap has a second refractive index and a second volume, the first refractive index is higher than the second refractive index, and the first volume is lower than the second volume.

In yet another example embodiment, a refractive index of the insulating layer may be lower than that of the substrate.

In yet another example embodiment, an upper portion of the trench may be delimited by the insulating layer.

In yet another example embodiment, the insulating layer may extend along a bottom surface and sidewalls of the trench.

In yet another example embodiment, a thickness of the insulating layer on the first surface of the substrate may be equal to that of the insulating layer on the bottom surface and the sidewalls of the trench.

In yet another example embodiment, a width of a bottom portion of the insulating pattern may be narrower than a width of an intermediate portion of the insulating pattern.

In yet another example embodiment, a width of an upper portion of the insulating pattern may be narrower than a width of an intermediate portion of the insulating pattern.

BRIEF DESCRIPTION OF THE DRAWINGS

The inventive concepts will become more apparent in view of the attached drawings and accompanying detailed description.

DETAILED DESCRIPTION

Figure 1:
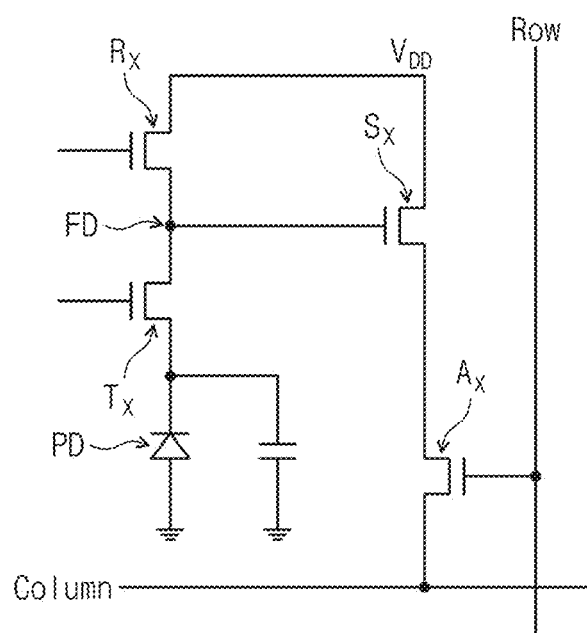
FIG. 1 is an equivalent circuit diagram illustrating an image sensor according to some example embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the example embodiments in the detailed description will be described with sectional views as ideal example views of the inventive concepts. Accordingly, shapes of the example views may be modified according to manufacturing techniques and/or allowable errors. Therefore, the example embodiments of the inventive concepts are not limited to the specific shape illustrated in the example views, but may include other shapes that may be created according to manufacturing processes. Areas illustrated in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some example embodiments could be termed a second element in other example embodiments without departing from the teachings of the present inventive concepts. Example embodiments of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Devices and methods of forming devices according to various example embodiments described herein may be embodied in microelectronic devices such as integrated circuits, wherein a plurality of devices according to various example embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various example embodiments described herein may include a plurality of the devices in an array and/or in a two-dimensional pattern that is based on the functionality of the microelectronic device.

The devices according to various example embodiments described herein may be interspersed among other devices depending on the functionality of the microelectronic device. Moreover, microelectronic devices according to various example embodiments described herein may be replicated in a third direction that may be orthogonal to the two different directions, to provide three-dimensional integrated circuits.

Accordingly, the cross-sectional view(s) illustrated herein provide support for a plurality of devices according to various example embodiments described herein that extend along two different directions in a plan view and/or in three different directions in a perspective view.

Figure 2A:
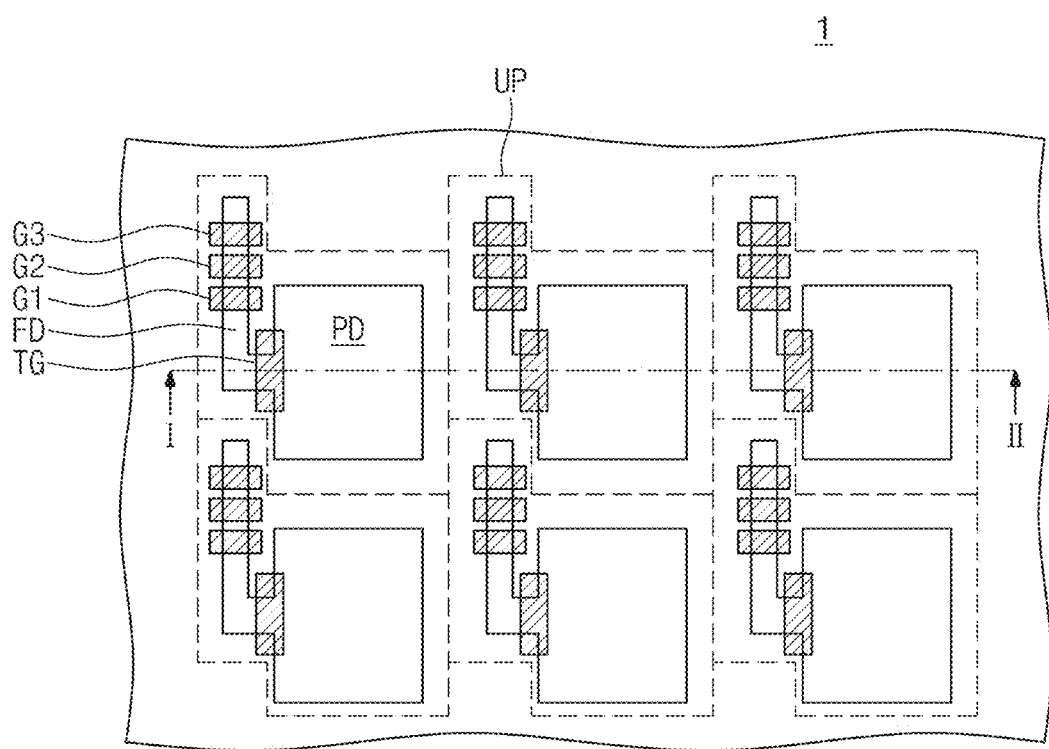
FIG. 2A is a plan view illustrating an image sensor according to some example embodiments of the inventive concepts.

FIG. 1 is an equivalent circuit diagram illustrating an image sensor according to some example embodiments of the inventive concepts. FIG. 2A is a plan view illustrating an image sensor according to some example embodiments of the inventive concepts.

Referring to FIGS. 1 and 2A, each of unit pixel regions of an image sensor may include a photoelectric conversion part PD, a transfer transistor Tx, a reset transistor Rx, a source follower transistor Sx, and an access transistor Ax. The transfer transistor Tx, the reset transistor Rx, the source follower transistor Sx, and the access transistor Ax may include a transfer gate TG, a rest gate G1, a source follower gate G2, and an access gate G3, respectively. The photoelectric conversion part PD may be a photodiode including an N-type dopant region and a P-type dopant region. In other example embodiments, the photoelectric conversion part PD may include a plurality of photodiodes vertically stacked. The transfer gate TG of the transfer transistor Tx may be disposed on a semiconductor substrate or may extend into the semiconductor substrate. The semiconductor substrate may include a semiconductor epitaxial layer. A drain of the transfer transistor Tx may correspond to a floating diffusion region FD. In addition, the floating diffusion region FD may also correspond to a source of the reset transistor Rx. The floating diffusion region FD may be electrically connected to the source follower gate G2 of the source follower transistor Sx. The source follower transistor Sx and the reset transistor Rx may be connected in series to each other. The source follower transistor Sx may be connected to the access transistor Ax. The reset transistor Rx, the source follower transistor Sx, and the access transistor Ax may be shared by pixels adjacent to each other, and thus, an integration density of the image sensor may be improved.

A method of operating of the image sensor will be described hereinafter. A power voltage VDD may be applied to drains of the reset transistor Rx and the source follower transistor Sx in a condition that light is shielded, so charges remaining in the floating diffusion region FD may be discharged. Thereafter, if the reset transistor Rx is turned-off and light is incident on the photoelectric conversion part PD, electron-hole pairs may be generated in the photoelectric conversion part PD. Holes may be moved into and then accumulated in the P-type dopant region, and electrons may be moved into and then accumulated in the N-type dopant region. If the transfer transistor Tx is turned-on, charges (e.g., electrons and holes) may be transferred into and then accumulated in the floating diffusion region FD. A gate bias of the source follower transistor Sx may be changed in proportion to the amount of the charges accumulated in the floating diffusion region FD, and thus, a source potential of the source follower transistor Sx may be changed. At this time, if the access transistor Ax is turned-on, a signal corresponding to the charges may be sensed through a column line.

As the image sensor is being highly integrated, a size of the photoelectric conversion part PD may be reduced. Thus, the amount of light received in the photoelectric conversion part PD may also be reduced. According to embodiments of the inventive concepts, a device isolation pattern isolating the pixel regions from each other may include an air gap, and thus, crosstalk between the pixel regions may be reduced or prevented.

Figure 2B:
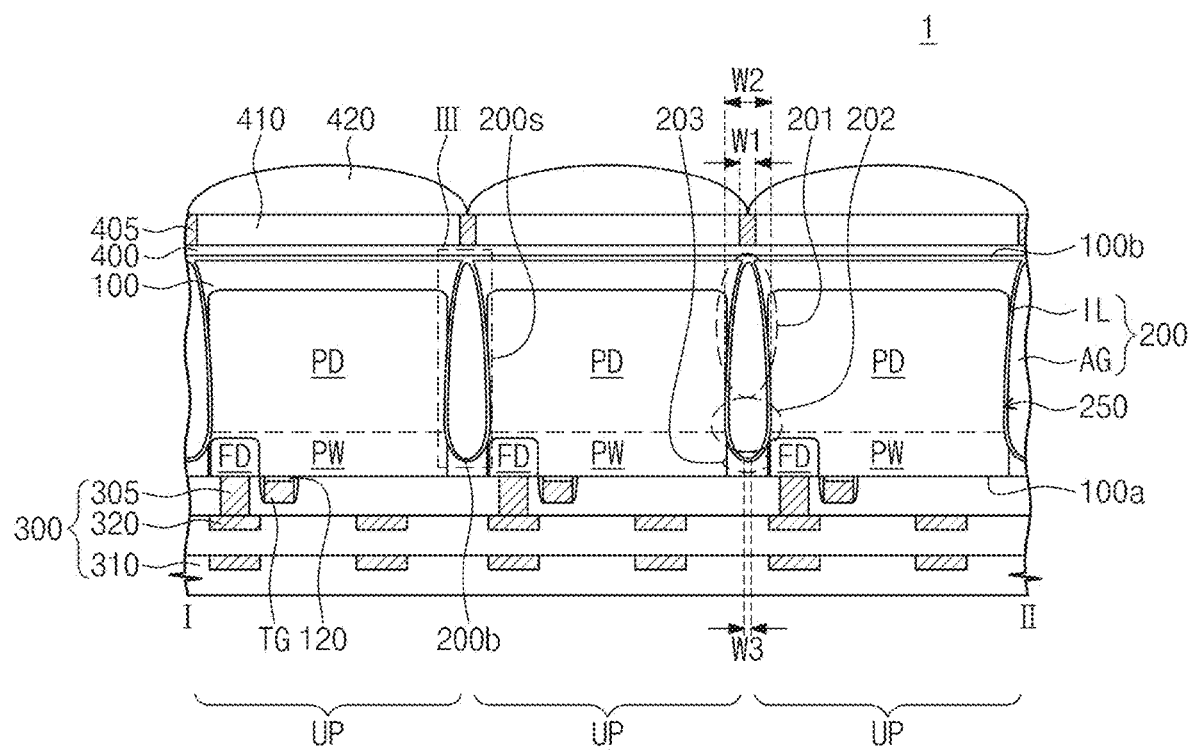
FIG. 2B is a cross-sectional view taken along a line I-II of FIG. 2A.

FIG. 2A is a plan view illustrating an image sensor according to some example embodiments of the inventive concepts, and FIG. 2B is a cross-sectional view taken along a line I-II of FIG. 2A.

Referring to FIGS. 2A and 2B, an image sensor 1 may include a substrate 100, a device isolation pattern 200, and photoelectric conversion parts PD. The substrate 100 may have a first surface 100a and a second surface 100b opposite to each other. The first surface 100a may correspond to a front side of the substrate 100, and the second surface 100b may correspond to a back side of the substrate 100. For example, the substrate 100 may be a semiconductor substrate (e.g., a silicon substrate, a germanium substrate, a silicon-germanium substrate, a II-VI group compound semiconductor substrate, or a III-V group compound semiconductor substrate) or a silicon-on-insulator (SOI) substrate.

The substrate 100 may include a plurality of pixel regions UP. The device isolation pattern 200 may be provided in the substrate 100 to define the pixel regions UP. For example, the device isolation pattern 200 may be provided between the pixel regions UP. As illustrated in FIG. 2B, the device isolation pattern 200 may be a deep-trench isolation pattern provided in a trench 250 recessed from the second surface 100b of the substrate 100. In an example embodiment, the device isolation pattern 200 may be spaced apart from the first surface 100a of the substrate 100. In an example embodiment, the device isolation pattern 200 may extend onto the second surface 100b of the substrate 200 to cover the second surface 100b.

According to example embodiments, an upper portion 201 of the device isolation pattern may be adjacent to the second surface 100b of the substrate 100, and a lower portion 203 of the device isolation pattern 200 may be adjacent to the first surface 100a of the substrate 100. In the present specification, an intermediate portion 202 of the device isolation pattern 200 may be provided between the upper portion 201 and the lower portion 203 and may be defined as a portion of the device isolation pattern 200 which has the maximum width W2. Heights of the upper, intermediate and lower portions 201, 202 and 203 may be variously modified. The device isolation pattern according to the inventive concepts will be described in more detail.

Figure 2C:
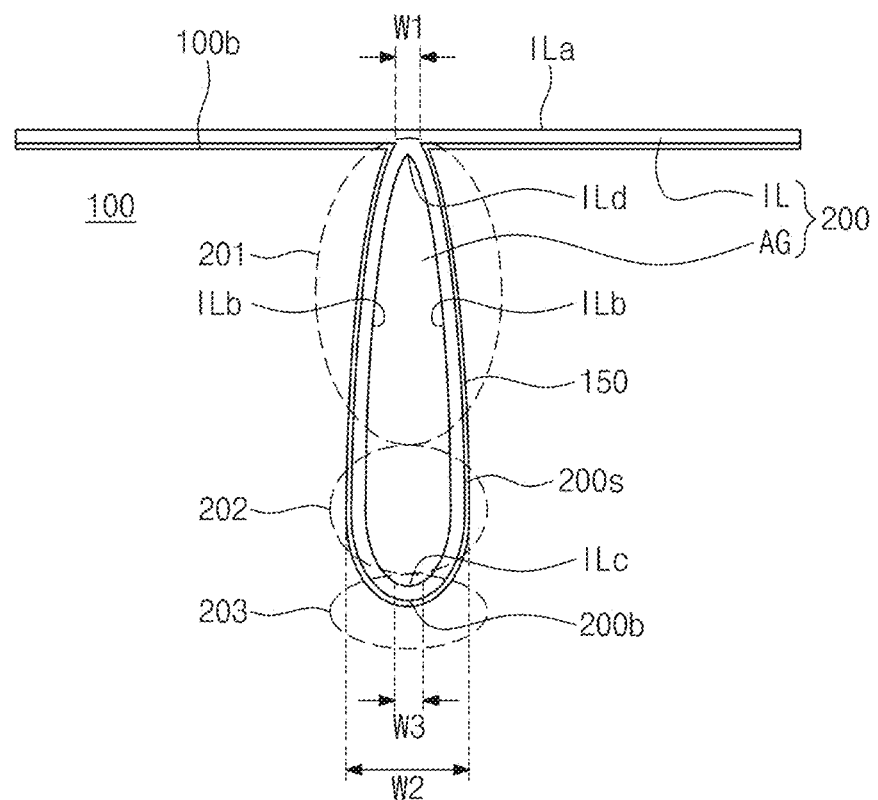
FIGS. 2C and 2D are enlarged views of a portion 'III' of FIG. 2A to illustrate some example embodiments of a device isolation pattern.
Figure 2D:
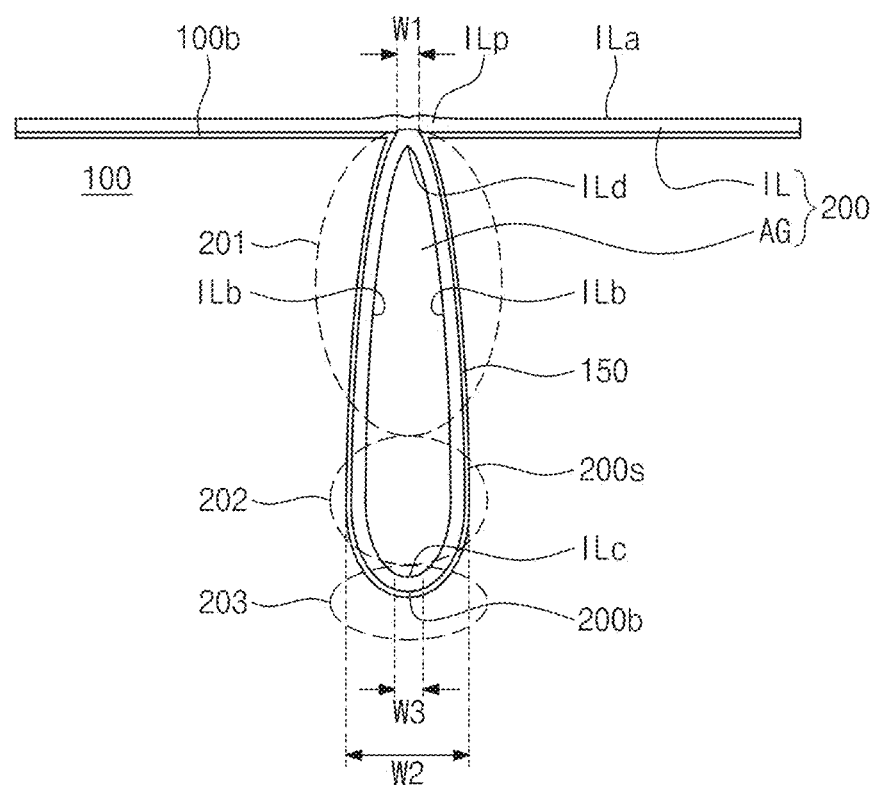

FIGS. 2C and 2D are enlarged views of a portion 'III' of FIG. 2A to illustrate some example embodiments of a device isolation pattern.

Referring to FIGS. 2B, 2C, and 2D, a width of the upper portion 201 of the device isolation pattern 200 may increase as a distance from the second surface 100b of the substrate 100 increases. The width of the upper portion 201 of the device isolation pattern 200 may be narrower than that of the intermediate portion 202 of the device isolation pattern 200. For example, a width W1 of the upper portion 201 of the device isolation pattern 200 at the same level as the second surface 100b of the substrate 100 may be narrower than the maximum width W2 of the device isolation pattern 200. The width W1 of the upper portion 201 of the device isolation pattern 200 at the same level as the second surface 100b of the substrate 100 may be in a range of about 30 nm to about 250 nm. The maximum width W2 of the intermediate portion 202 of the device isolation pattern 200 may be in a range of about 200 nm to about 300 nm. Here, the width of the device isolation pattern 200 may be defined as a distance between both sidewalls 200s of the device isolation pattern 200, and the sidewalls 200s may be coplanar with sidewalls of the trench 250 provided with the device isolation pattern 200. In other words, the sidewalls 200s of the device isolation pattern 200 may be in contact with the sidewalls of the trench 250. In addition, the increase or decrease in the width of the device isolation pattern 200 may not include an undesired error which may occur in a manufacturing process. A width of the lower portion 203 of the device isolation pattern 200 may decrease as a distance from a bottom surface 200b of the device isolation pattern 200 decreases. A width W3 of the bottom surface 200b of the device isolation pattern 200 may be narrower than the maximum width W2 of the intermediate portion 202. In some example embodiments, the upper portion 201 of the device isolation pattern 200 may have a convex cross section toward the second surface 100b, and the lower portion 203 of the device isolation pattern 200 may have a convex cross section toward the first surface 100a. However, the inventive concepts are not limited thereto.

The device isolation pattern 200 may include an insulating layer IL provided on the bottom surface 200b and the sidewalls 200s of the device isolation pattern 200. The insulating layer IL may also be provided on the second surface 100b of the substrate 100, and thus, the upper portion 201 of the device isolation pattern 200 may be delimited by or closed with the insulating layer IL. The insulating layer IL may conformally cover the sidewalls 200s and the bottom surface 200b of the device isolation pattern 200 and the second surface 100b of the substrate 100. The insulating layer IL may have a thickness of about 5 nm to about 7 nm. The insulating layer IL disposed on the sidewalls 200s of the device isolation pattern 200 may have a substantially uniform thickness. The thickness of the insulating layer IL disposed on the second surface 100b of the substrate 100 may be substantially equal to that of the insulating layer IL disposed on the sidewalls 200s and the bottom surface 200b of the device isolation pattern 200. In the present specification, the substantial equality of the thickness may have a tolerance which may not be undesired but may occur in a deposition process. The insulating layer IL may include a single-layer or a multi-layer. The insulating layer IL may include a material of which a refractive index is lower than that of the substrate 100. For example, the insulating layer IL may include a silicon-based insulating material (e.g., silicon nitride, silicon oxide, and/or silicon oxynitride) and/or a high-k dielectric material (e.g., hafnium oxide and/or aluminum oxide).

A natural oxide layer 150 may be provided in the substrate 100 adjacent to the insulating layer IL. For example, the natural oxide layer 150 may be disposed between the substrate 100 and the insulating layer IL and may be in contact with the insulating layer IL. The natural oxide layer 150 may have a thickness of about 1 nm to about 3 nm. In an example embodiment, a top surface ILa of the insulating layer IL disposed on the second surface 100b of the substrate 100 may be flat as illustrated in FIG. 2C. For example, the top surface ILa of the insulating layer IL blocking the trench 250 may be disposed at substantially the same level as the top surface ILa of the insulating layer IL disposed on the second surface 100b of the substrate 100. In another example embodiment, the insulating layer IL closing a top end of the trench 250 may have at least one protrusion ILp, as illustrated in FIG. 2D. For example, a top surface ILa of the insulating layer IL closing the top end of the trench 250 may be higher than the top surface ILa of the insulating layer IL disposed on the second surface 100b of the substrate 100.

An air gap AG may be provided in the device isolation pattern 200 and may be surrounded by the insulating layer IL. Inner sidewalls ILb of the insulating layer IL disposed on the both sidewalls 200s of the device isolation pattern 200 may be spaced apart from each other. A top surface ILc of the insulating layer IL disposed on the bottom surface 200b of the device isolation pattern 200 may be spaced apart from a bottom surface ILd of the insulating layer IL provided in the upper portion 201 of the device isolation pattern 200. The air gap AG may be provided in the substrate 100 by the insulating layer IL.

Referring again to FIG. 2B, the refractive index of the device isolation pattern 200 may be lower than that of the substrate 100. In some example embodiments, if the substrate 100 has a first refractive index n1 and the device isolation pattern 200 has a second refractive index n2, the device isolation pattern 200 may have a material that satisfies a conditional expression "(n1Sinθ)/n2>1". For example, the insulating layer IL may include a material that has a refractive index lower than that of the substrate 100 and satisfies the total reflection condition. Thus, a crosstalk phenomenon between the pixel regions UP may be reduced or prevented. For example, light may be obliquely incident on one of the pixel regions UP through the second surface 100b of the substrate 100. In this case, the light may be totally reflected by the device isolation pattern 200, so it may not be incident on neighboring pixel regions UP.

The device isolation pattern 200 may include the air gap AG surrounded by the insulating layer IL, and thus, the crosstalk phenomenon may be reduced. The air gap AG may include a material (e.g., air) of which a refractive index is lower than that of the insulating layer IL. As a volume ratio of the air gap AG to the device isolation pattern 200 increases in the substrate 100, a total refractive index of the device isolation pattern 200 may decrease. The insulating layer IL may have a relatively thin thickness and may conformally cover the sidewalls 200s and the bottom surface 200b of the device isolation pattern 200, and thus, the volume ratio of the air gap AG to the device isolation pattern 200 may be increased. As a result, the crosstalk between the pixel regions UP may be more reduced or prevented.

A photoelectric conversion part PD and a well region PW may be disposed in the substrate 100 of each of the pixel regions UP. The photoelectric conversion part PD may be deep from the first surface 100a of the substrate 100. In other words, the photoelectric conversion part PD may be spaced apart from the first surface 100a of the substrate 100. For example, the photoelectric conversion part PD may be a region doped with N-type dopants. The well region PW may be adjacent to the first surface 100a of the substrate 100. In other words, the well region PW may be disposed between the first surface 100a of the substrate 100 and the photoelectric conversion part PD. For example, the well region PW may be a region doped with P-type dopants. The photoelectric conversion PD and the well region PW may be in contact with each other to constitute a photodiode. A floating diffusion region FD may be disposed in each of the well regions PW. The floating diffusion region FD may be a region doped with dopants, and a conductivity type of the floating diffusion region FD may be opposite to that of the well region PW. For example, the floating diffusion region FD may be doped with N-type dopants. A transfer gate TG may be disposed on the first surface 100a of the substrate 100 of each of the pixel regions UP. A gate insulating layer 120 may be provided between the transfer gate TG and the substrate 100.

An interconnection structure 300 may be disposed on the first surface 100a of the substrate 100. The interconnection structure 300 may include a plurality of interlayer insulating layers 310 and a plurality of interconnections 320. One of the interlayer insulating layers 310 may be in contact with the first surface 100a of the substrate 100 and may cover the transfer gates TG. A contact 305 may penetrate at least one of the interlayer insulating layers 310 so as to be in contact with the floating diffusion region FD. Unlike FIG. 2B, the interconnection structure 300 may be disposed on the second surface 100b of the substrate 100 and may be disposed between the insulating layer IL and an anti-reflection layer 400.

The anti-reflection layer 400 may be disposed on the second surface 100b of the substrate 100 to cover the device isolation pattern 200. A color filter 410 and a micro-lens 420 may be disposed on the anti-reflection layer 400 of each of the pixel regions UP. The color filters 410 may be arranged in a matrix form to constitute a color filter array. In an example embodiment, the color filter array may be a Bayer pattern including a red filter, a green filter, and a blue filter. In other example embodiments, the color filter array may include a yellow filter, a magenta filter, and a cyan filter. In addition, the color filter array may further include a white filter. A grid pattern 405 may be disposed between the color filters 410 on the anti-reflection layer 400. In another example embodiment, the grid pattern 405 may be omitted.

FIGS. 3A to 3D are cross-sectional views illustrating a method of forming an image sensor according to some embodiments of the inventive concepts. Hereinafter, the descriptions mentioned above will be omitted or mentioned briefly to avoid duplication of explanation.

Figure 3A:
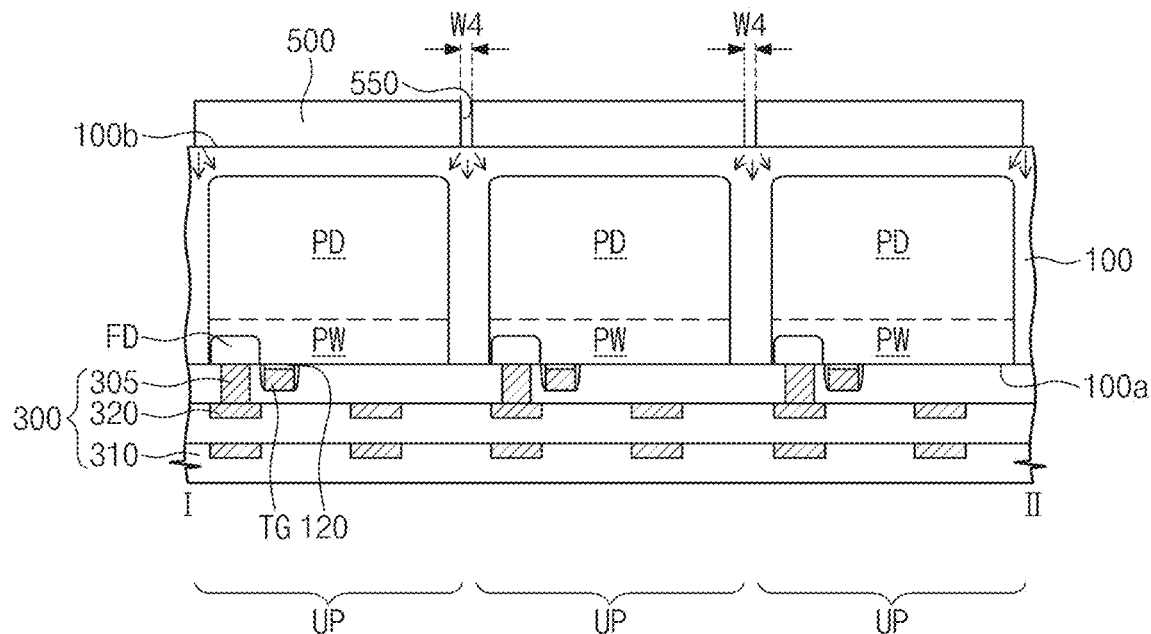
FIGS. 3A to 3D are cross-sectional views illustrating a method of forming an image sensor according to some example embodiments of the inventive concepts.
Figure 3B:
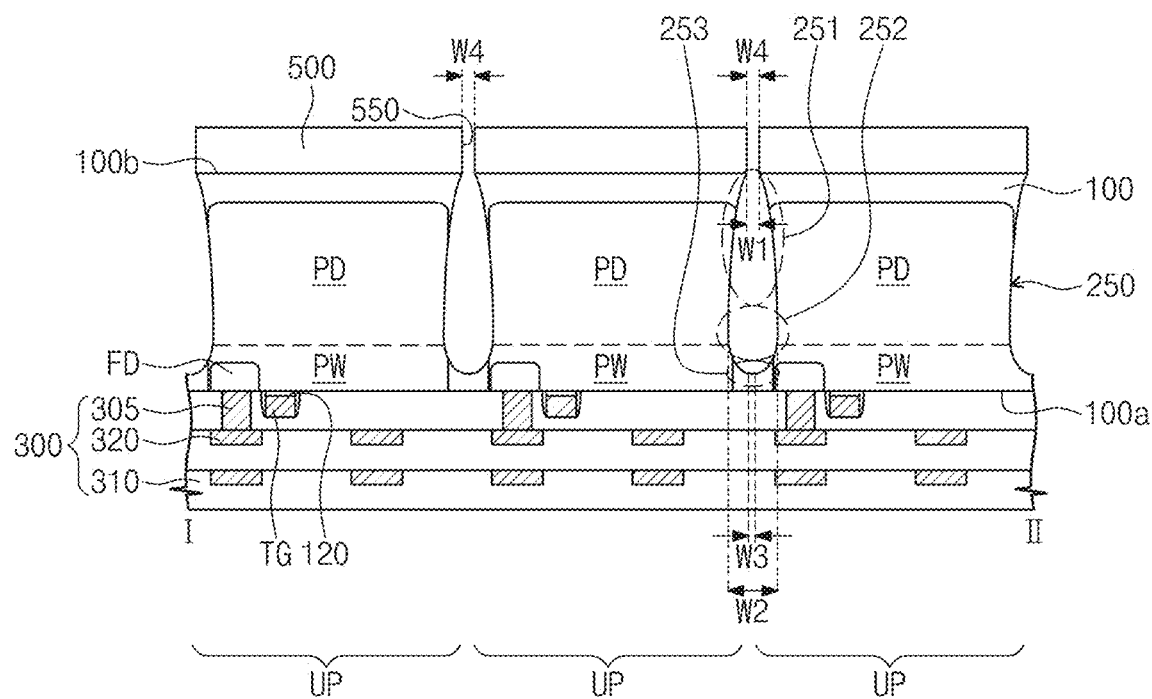

Referring to FIGS. 3A and 3B, a substrate 100 including a plurality of pixel regions UP may be prepared. At this time, a first surface 100a of the substrate 100 may face upward unlike FIG. 3A. A plurality of ion implantation processes may be performed on the first surface 100a of the substrate 100 to form photoelectric conversion parts PD, well regions PW, and floating diffusion regions FD in substrate 100 of the pixel regions UP, respectively. The substrate 100, the photoelectric conversion parts PD, the well regions PW, and the floating diffusion regions FD may be the same as described with reference to FIGS. 2A and 2B. A transfer gate TG may be formed on the first surface 100a of the substrate 100 of each of the pixel regions UP. In another example embodiment, the floating diffusion regions FD may be formed after the formation of the transfer gates TG. An interconnection structure 300 may be formed on the first surface 100a of the substrate 100. The interconnection structure 300 may include interlayer insulating layers 310, interconnections 320, and contacts 305. Thereafter, the substrate 100 may be overturned, so a second surface 100b of the substrate 100 may face upward.

A mask pattern 500 may be formed on the second surface 100b of the substrate 100. The mask pattern 500 may have an opening 550 having a given (or alternatively, predetermined) width W4, and the opening 550 may expose the second surface 100b of the substrate 100. The exposed second surface 100b of the substrate 100 may be etched to form a trench 250 in the substrate 100. The exposed second surface 100b may be isotropically etched. In some example embodiments, a process gas containing fluorine (e.g., a $SF_6$ gas) may be used during the isotropic etching process. The trench 250 may extend into the substrate 100 disposed under the mask pattern 500 by the isotropic etching process. A width W1 of the trench 250 at the same level as the second surface 100b of the substrate 100 may be substantially equal to or greater than the width W4 of the opening 550. A width of an upper portion 251 of the trench 250 may increase as a distance from the second surface 100b increases. A shape of a cross section of the trench 250 may correspond to the shape of the cross section of the device isolation pattern 200 described with reference to FIGS. 2A and 2B. The intermediate portion 252 of the trench 250 may have the maximum width W2 of the trench 250. A width of a lower portion 253 of the trench 250 may decrease as a distance from a bottom surface of the trench 250 decreases. A width of the bottom surface of the trench 250 may be narrower than a width (e.g., the maximum width W2) of the intermediate portion 252 of the trench 250. The widths W1, W2 and W3 of the trench 250 illustrated in FIG. 3B may be substantially equal to the widths W1, W2 and W3 of the device isolation pattern 200 illustrated in FIGS. 2B to 2D, respectively. In an example embodiment, the upper portion 251 of the trench 250 may have a cross section having an upward convex curvature, and the lower portion 253 of the trench 250 may have a cross section having a downward convex curvature. However, the inventive concepts are not limited thereto. The trench 250 may be formed between the pixel regions UP in the substrate 100. Next, the mask pattern 500 may be removed.

Figure 3C:
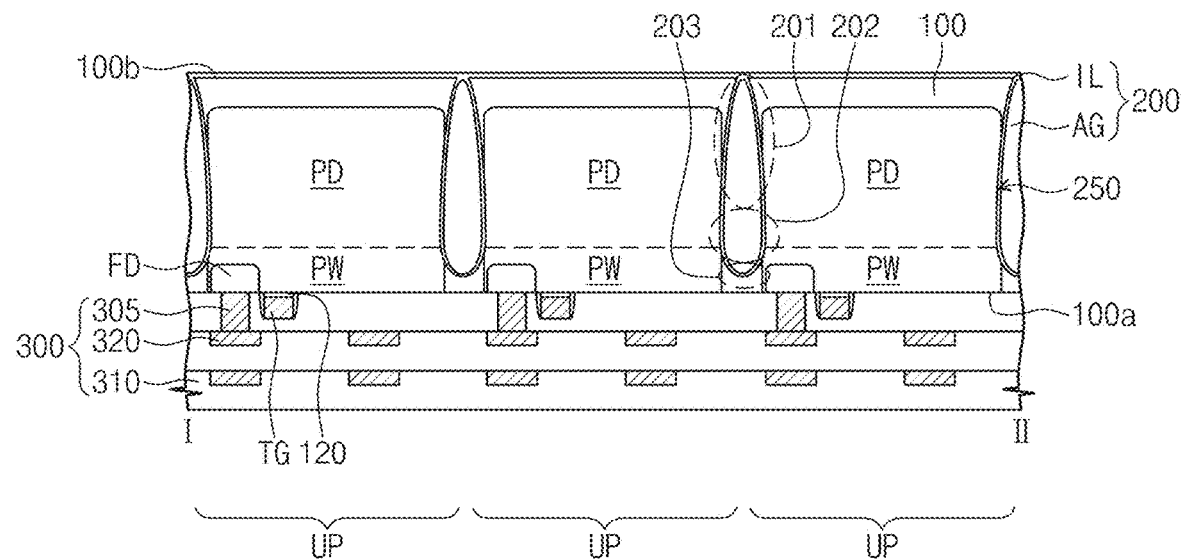

Referring to FIGS. 3B and 3C, an insulating layer IL may be formed on the second surface 100b of the substrate 100 and an inner surface of the trench 250, and thus, a device isolation pattern 200 including an air gap AG may be formed. The insulating layer IL may be formed of an insulating material of which a refractive index is lower than that of the substrate 100. For example, the insulating layer IL may include the silicon-based material (e.g., silicon nitride, silicon oxide, and/or silicon oxynitride) and/or the high-k dielectric material (e.g., hafnium oxide and/or aluminum oxide), as described with reference to FIGS. 2A and 2B. The insulating layer IL may be formed by an atomic nucleus deposition method with excellent step coverage and may be deposited on the second surface 100b of the substrate 100 and sidewalls and the bottom surface of the trench 250. A top end of the upper portion 251 of the trench 250 may be delimited by or closed with the insulating layer IL, so the air gap AG may be formed in the device isolation pattern 200. The device isolation pattern 200 may be formed in the substrate 100 and may cover the second surface 100b of the substrate 100. The insulating layer IL may have a thickness of about 5 nm to about 7 nm. According to embodiments of the inventive concepts, the width of the upper 251 of the trench 250 may be narrower than that of the intermediate portion 252 of the trench 250, and thus, the trench 250 may be more easily delimited by or closed with the insulating layer IL even though the insulating layer IL is conformally formed with a relatively thin thickness. In other words, the air gap AG may be easily formed in the device isolation pattern 200.

Referring to FIGS. 2C, 2D, and 3C, a natural oxide layer 150 may be further formed between the substrate 100 and the insulating layer IL. The inner surface of the trench 250 and the second surface 100b of the substrate 100 may be exposed before or during the deposition process of the insulating layer IL. The exposed substrate 100 may be oxidized to form the natural oxide layer 150 adjacent to the insulating layer IL. The natural oxide layer 150 may be formed in the substrate 100 adjacent to the inner surface of the trench 250 and the second surface 100b of the substrate 100. The insulating layer IL blocking the top end of the trench 250 may have the flat top surface illustrated in FIG. 2C or the top surface including the protrusion illustrated in FIG. 2D.

Figure 3D:
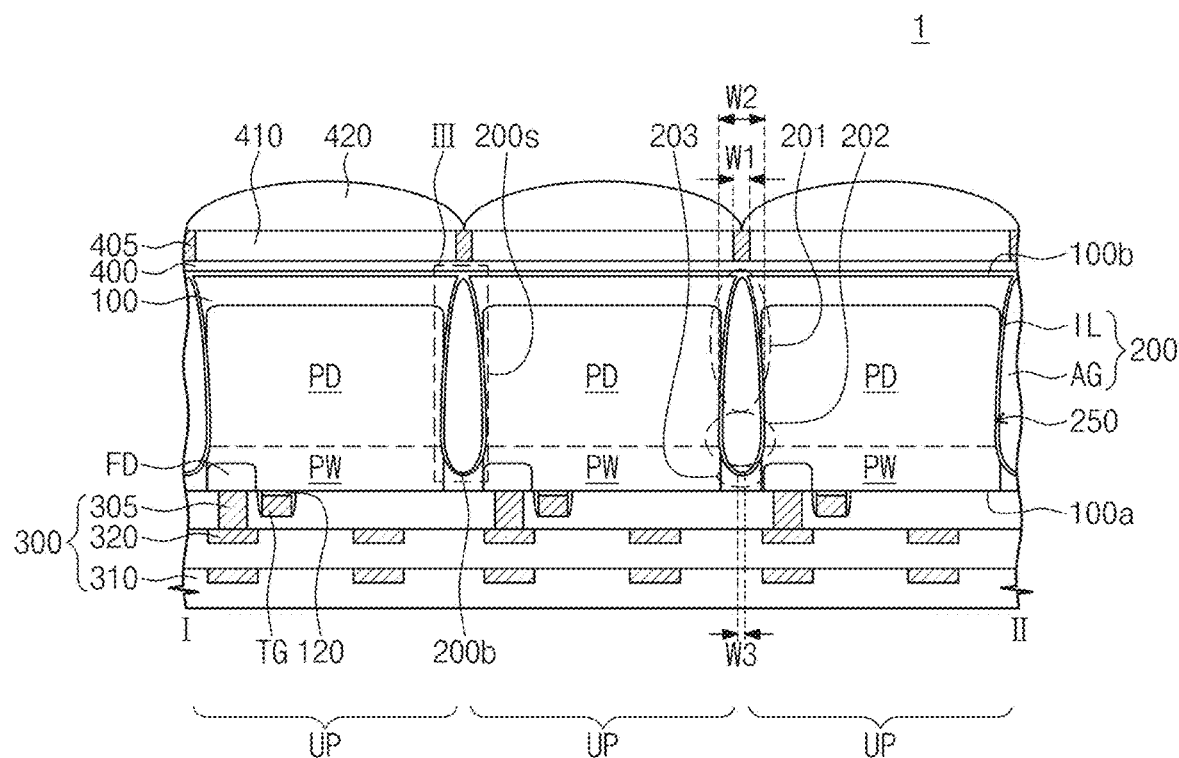

Referring to FIG. 3D, an anti-reflection layer 400, a grid pattern 405, color filters 410, and micro-lenses 420 may be formed on the second surface 100b of the substrate 100. The anti-reflection layer 400, the grid pattern 405, the color filters 410, and the micro-lenses 420 may be the same as described with reference to FIGS. 2A and 2B. The image sensor 1 may be manufactured by the manufacturing processes described above.

Figure 4:
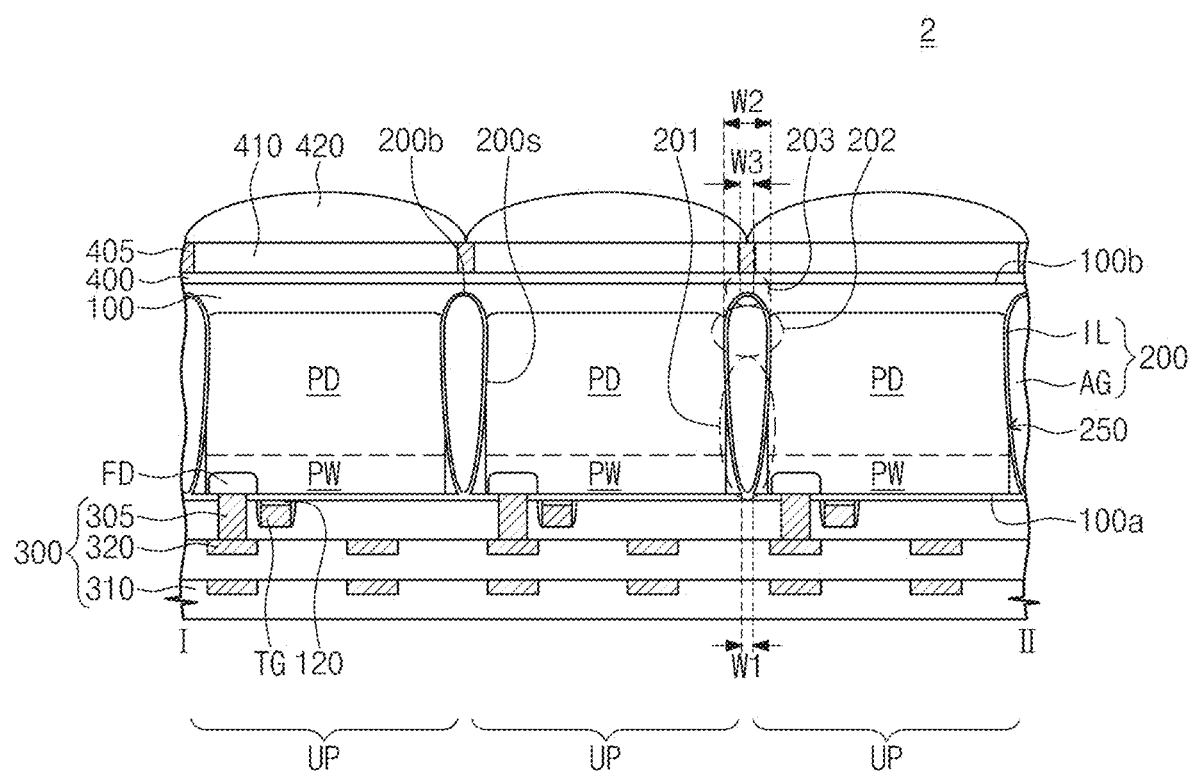
FIG. 4 is a cross-sectional view illustrating an image sensor according to other example embodiments of the inventive concepts.

FIG. 4 is a cross-sectional view corresponding to the line I-II of FIG. 2A to illustrate an image sensor according to other example embodiments of the inventive concepts.

Referring to FIG. 4, an image sensor 2 may include a substrate 100, a device isolation pattern 200, and photoelectric conversion parts PD. An interconnection structure 300 may be disposed on a first surface 100a of the substrate 100. The interconnection structure 300 may include interlayer insulating layers 310 and interconnections 320. An anti-reflection layer 400, a grid pattern 405, color filters 410, and micro-lenses 420 may be disposed on a second surface 100b of the substrate 100. In another example embodiment, unlike FIG. 4, the interconnection structure 300 may be disposed between the anti-reflection layer 400 and the second surface 100b of the substrate 100.

The substrate 100 may include a plurality of pixel regions UP. A device isolation pattern 200 may be provided in the substrate 100 to define the pixel regions UP. The device isolation pattern 200 may be provided in a trench 250 recessed from the first surface 100a of the substrate 100. The device isolation pattern 200 may extend onto the first surface 100a of the substrate 100 to cover the first surface 100a. A bottom surface 200b of the device isolation pattern 200 may be adjacent to the second surface 100b of the substrate 100 but may be spaced apart from the second surface 100b.

In example embodiments, an upper portion 201 of the device isolation pattern 200 may be adjacent to the first surface 100a of the substrate 100, and a lower portion 203 of the device isolation pattern 200 may be adjacent to the second surface 100b of the substrate 100. The upper portion 201 of the device isolation pattern 200 may have a narrower width than an intermediate portion 202 of the device isolation pattern 200. A width of the upper portion 201 may increase as a distance from the first surface 100a of the substrate 100 increases. For example, a width W1 of the upper portion 201 of the device isolation pattern 200 at the same level as the first surface 100a may be in a range of about 30 nm to about 250 nm. The intermediate portion 202 of the device isolation pattern 200 may have the maximum width W2 of about 200 nm to about 300 nm. A width of the lower portion 203 of the device isolation pattern 200 may decrease as a distance from the bottom surface 200b of the device isolation pattern 200 decreases. A width W3 of the bottom surface 200b of the device isolation pattern 200 may be narrower than the maximum width W2 of the intermediate portion 202. In an example embodiment, the upper portion 201 of the device isolation pattern 200 may have a cross section which is convex toward the first surface 100a of the substrate 100, and the lower portion 203 of the device isolation pattern 200 may have a cross section which is convex toward the second surface 100b of the substrate 100. However, the inventive concepts are not limited thereto.

The device isolation pattern 200 may include an insulating layer IL provided on the bottom surface 200b and sidewalls 200s of the device isolation pattern 200. The insulating layer IL may include the silicon-based material and/or the high-k dielectric material described with reference to FIGS. 2A and 2B. The insulating layer IL may also be provided on the first surface 100a of the substrate 100, and thus, the upper portion 201 of the device isolation pattern 200 may be delimited by or closed with the insulating layer IL. The insulating layer IL may conformally cover the sidewalls 200s and the bottom surface 200b of the device isolation pattern 200 and the first surface 100a of the substrate 100. The insulating layer IL may have a thickness of about 5 nm to about 7 nm. The thickness of the insulating layer IL disposed on the first surface 100a of the substrate 100 may be substantially equal to that of the insulating layer IL disposed on the sidewalls 200s and the bottom surface 200b of the device isolation pattern 200. As described with reference to FIGS. 2C and 2D, the natural oxide layer 150 may be provided in the substrate 100 adjacent to the insulating layer IL. In other words, the natural oxide layer 150 may be disposed between the substrate 100 and the insulating layer IL.

An air gap AG may be provided in the device isolation pattern 200 between the pixel regions UP of the substrate 100 and may be surrounded by the insulating layer IL. The device isolation pattern 200 may have a refractive index lower than that of the substrate 100. For example, a refractive index of the insulating layer IL may be lower than that of the substrate 100, and a refractive index of the air gap AG may be lower than that of the insulating layer IL. Since the insulating layer IL is conformally formed with a relatively thin thickness, a volume ratio of the air gap AG to the device isolation pattern 200 may be increased. As a result, crosstalk between the pixel regions UP may be reduced or prevented.

A photoelectric conversion part PD, a well region PW, and a floating diffusion region FD may be disposed in the substrate 100 of each of the pixel regions UP. A transfer gate TG may be disposed on the first surface 100a of the substrate 100 of each of the pixel regions UP. The photoelectric conversion parts PD, the well regions PW, the floating diffusion regions FD, and the transfer gates TG may be the same as described with reference to FIGS. 2A and 2B.

A method of forming the image sensor 2 according to the present example embodiment will be described hereinafter.

Figure 5A:
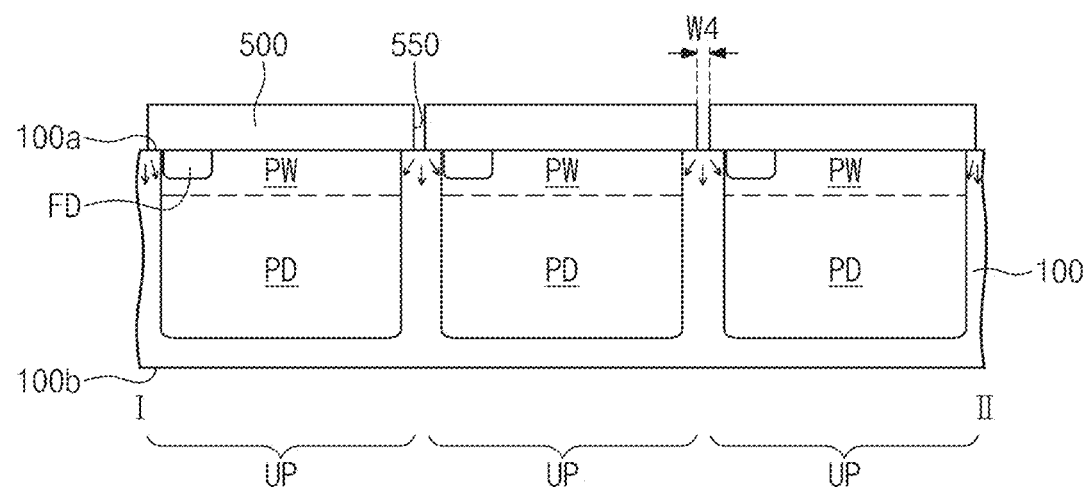
FIGS. 5A to 5C are cross-sectional views illustrating an example embodiment of a method of forming the image sensor of FIG. 4.
Figure 5B:
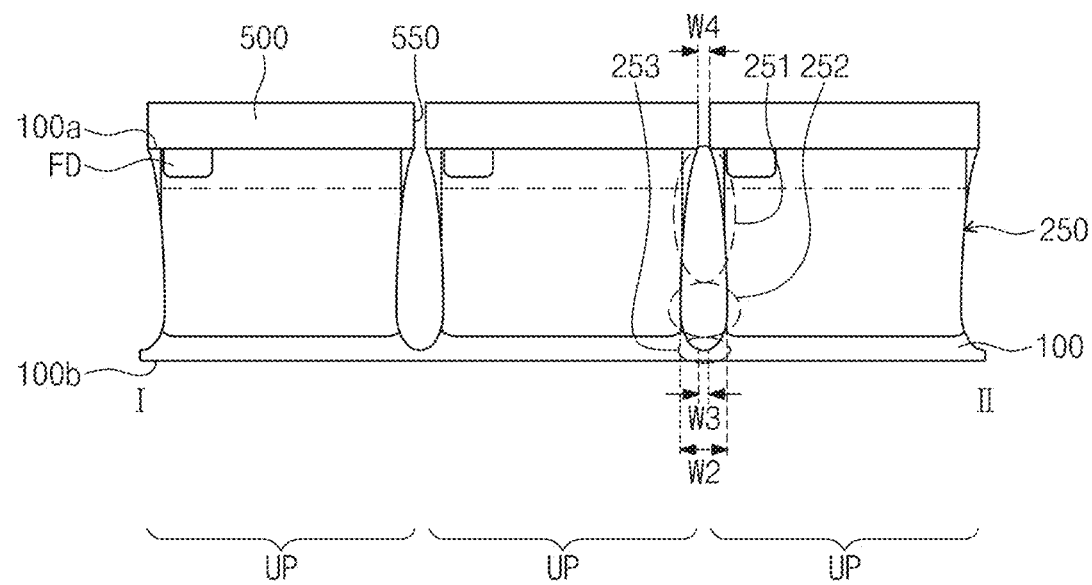
Figure 5C:
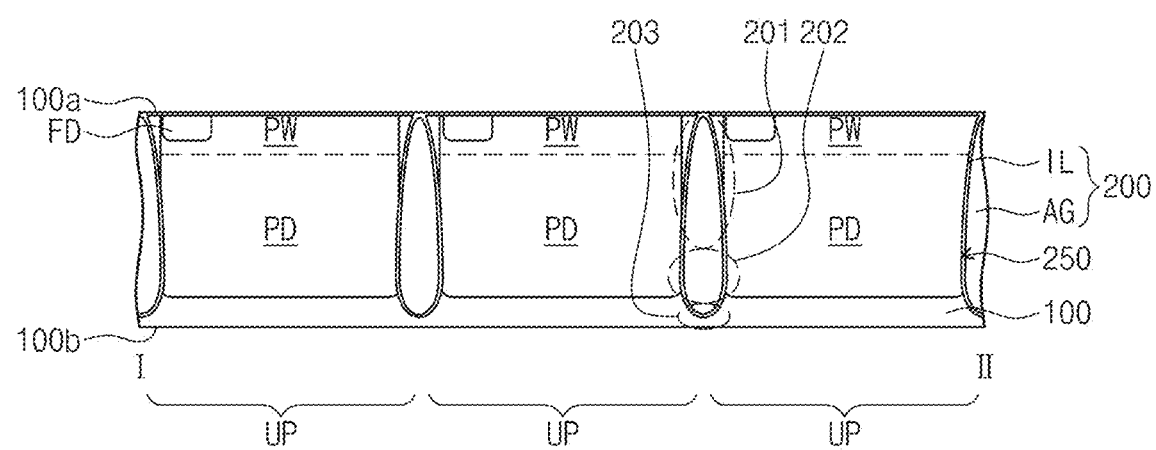

FIGS. 5A to 5C are cross-sectional views illustrating an example embodiment of a method of forming the image sensor of FIG. 4. Hereinafter, the descriptions mentioned above will be omitted or mentioned briefly to avoid duplication of explanation.

Referring to FIGS. 5A and 5B, a substrate 100 including a plurality of pixel regions UP may be prepared. A photoelectric conversion part PD, a well region PW, and a floating diffusion region FD may be formed in substrate 100 of each of the pixel regions UP. Unlike FIG. 3B, a mask pattern 500 may be formed on the first surface 100a of the substrate 100 to expose the first surface 100a. The substrate 100 exposed by the mask pattern 500 may be isotropically etched to form a trench 250. The isotropic etching process may be performed under the same condition as described with reference to FIGS. 3A and 3B. A cross-sectional shape and widths of the trench 250 may correspond to the cross-sectional shape and the widths of the device isolation pattern 200 illustrated in FIG. 4. A width W1 of an upper portion 251 of the trench 250 at the same level as the first surface 100a may be equal to or greater than a width W4 of an opening 550 of the mask pattern 500. A width of the upper portion 251 of the trench 250 may increase as a distance from the first surface 100a increases. An intermediate portion 252 of the trench 250 may have the maximum width W2 of the trench 250. A width of a lower portion 253 of the trench 250 may decrease as a distance from a bottom surface of the trench 250 decreases. Thereafter, the mask pattern 500 may be removed.

Referring to FIG. 5C, an insulating layer IL may be formed on the first surface 100a of the substrate 100 and an inner surface of the trench 250 to form a device isolation pattern 200 including an air gap AG. The formation process of the insulating layer IL may be performed as described with reference to FIG. 3C. The upper portion 251 of the trench 250 may be delimited by or closed with the insulating layer IL, and thus, the air gap AG may be formed on the device isolation pattern 200. The insulating layer IL may have a thickness of about 5 nm to about 7 nm. According to embodiments of the inventive concepts, the upper portion 251 of the trench 250 may be narrower than the intermediate portion 252 of the trench 250, so the upper portion 251 of the trench 250 may be more easily delimited by or closed with the insulating layer IL. As a result, the air gap AG may be easily formed. A natural oxide layer 150 may be further formed in the substrate 100 adjacent to the insulating layer IL.

Referring again to FIG. 4, transfer gates TG and an interconnection structure 300 may be formed on the first surface 100a of the substrate 100. The interconnection structure 300 may cover the transfer gates TG. In an example embodiment, the floating diffusion regions FD may be formed after the formation of the transfer gates TG. Next, the substrate 100 may be overturned, so the second surface 100b of the substrate 100 may face upward. The anti-reflection layer 400, the grid pattern 405, the color filters 410, and the micro-lenses 420 may be formed on the second surface 100b of the substrate 100 to manufacture the image sensor 2.

Figure 6A:
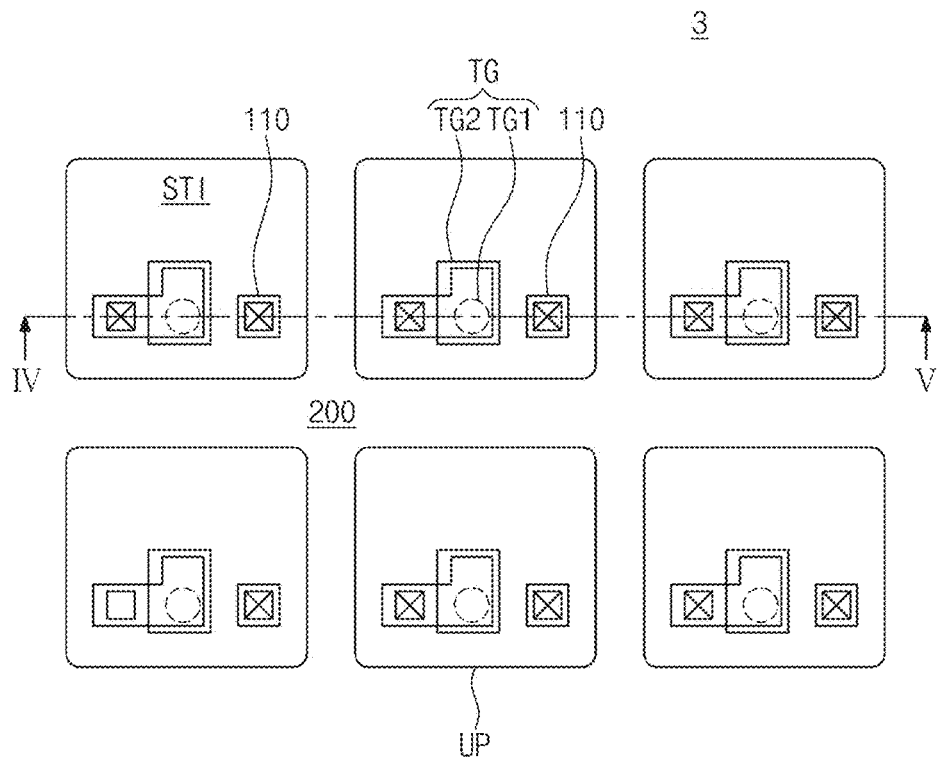
FIG. 6A is a plan view illustrating an image sensor according to still other example embodiments of the inventive concepts.
Figure 6B:
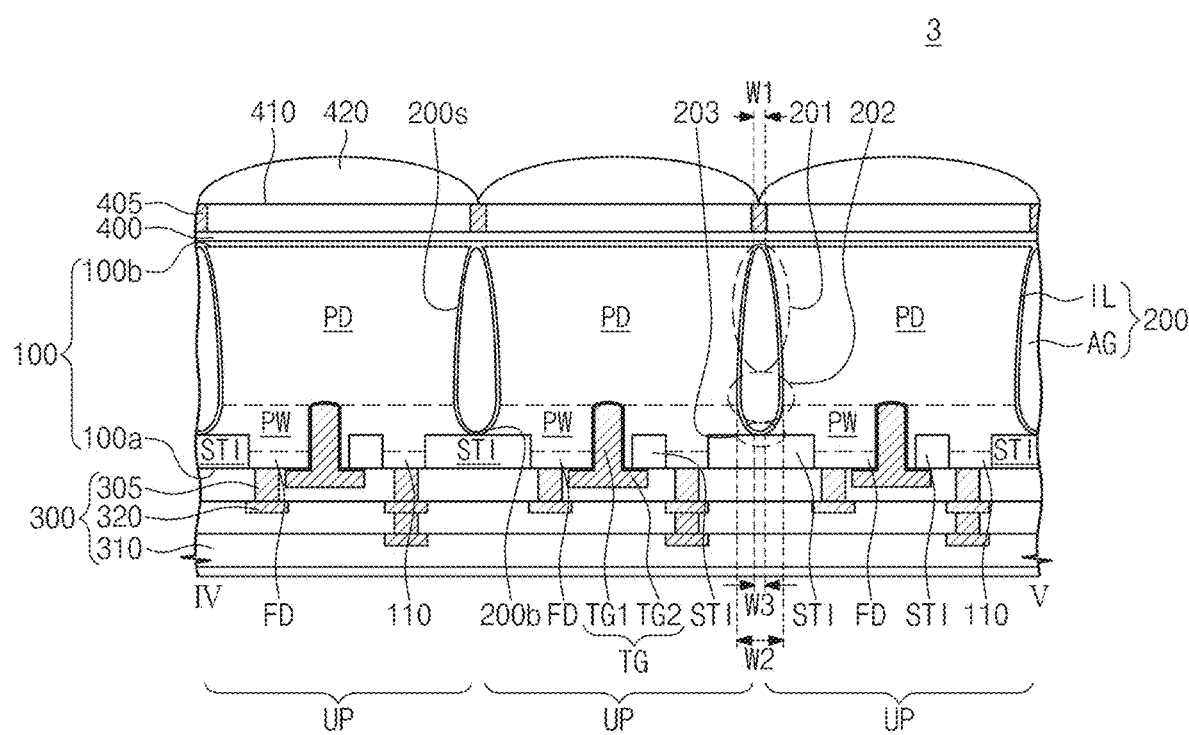
FIG. 6B is a cross-sectional view taken along a line IV-V of FIG. 6A.

FIG. 6A is a plan view illustrating an image sensor according to still other example embodiments of the inventive concepts. FIG. 6B is a cross-sectional view taken along a line IV-V of FIG. 6A.

Referring to FIGS. 6A and 6B, an image sensor 3 may include a substrate 100, a device isolation pattern 200, and photoelectric conversion parts PD. A first surface 100a of the substrate 100 may correspond to a front side, and a second surface 100b of the substrate 100 may correspond to a back side. An interconnection structure 300 may be disposed on the first surface 100a of the substrate 100. An anti-reflection layer 400, a grid pattern 405, color filters 410, and micro-lenses 420 may be disposed on the second surface 100b of the substrate and may be the same as described with reference to FIGS. 2A and 2B. Unlike FIGS. 6A and 6B, the interconnection structure 300 may be disposed on the second surface 100b of the substrate 100 and may be disposed between an insulating layer IL and the anti-reflection layer 400.

The photoelectric conversion part PD and a well region PW may be disposed in the substrate 100 of each of the pixel regions UP. The photoelectric conversion part PD may be deep from the first surface 100a of the substrate 100. The photoelectric conversion part PD may be a region which is doped with N-type dopants in the substrate 100. The well region PW may be adjacent to the first surface 100a of the substrate 100 and may be disposed between the first surface 100a and the photoelectric conversion part PD. The well region PW may be a region doped with P-type dopants. The well region PW and the photoelectric conversion part PD may constitute a photodiode.

A shallow device isolation layer STI may be provided in the well region PW to define an active region of the transistors Tx, Rx, Ax and Sx. The shallow device isolation layer STI may be shallower than the device isolation pattern 200. In a region, the shallow device isolation layer STI and the device isolation pattern 200 may vertically overlap with each other.

A gate insulating layer may be disposed between the substrate 100 and a transfer gate TG. A top surface of the transfer gate TG may be higher than the first surface 100a of the substrate 100, and a bottom surface of the transfer gate TG may be disposed in the well region PW. The transfer gate TG may include a protruding portion TG2 and a buried portion TG1. The protruding portion TG2 may be disposed on the first surface 100a of the substrate 100 and may be covered by the interconnection structure 300. The buried portion TG1 may extend into the substrate 100. A floating diffusion region FD may be disposed between one sidewall of the buried portion TG1 and the shallow device isolation layer STI in the substrate 100. The floating diffusion region FD may be a region doped with N-type dopants. The shallow device isolation layer STI may further define an additional active region spaced apart from the active region in each of the pixel regions UP. The additional active region may also be spaced apart from the transfer gate TG. A ground dopant region 110 may be disposed in the additional active region. The ground dopant region 110 may be dopant with dopants of the same conductivity type as dopants of the well region PW. For example, the ground dopant region 110 may be doped with P-type dopants. Here, a dopant concentration of the ground dopant region 110 may be higher than that of the well region PW. The floating diffusion region FD and the ground dopant region 110 may be electrically connected to interconnections 320 through contacts 305.

The substrate 100 may include a plurality of the pixel regions UP. The device isolation pattern 200 may be provided in the substrate 100 to define the pixel regions UP. The device isolation pattern 200 may be a deep-trench isolation pattern provided in a trench 250 recessed from the second surface 100b of the substrate 100. The device isolation pattern 200 may extend onto the second surface 100b to cover the second surface 100b.

In the present example embodiment, an upper portion 201 of the device isolation pattern 200 may be adjacent to the second surface 100b of the substrate 100, and a lower portion 203 of the device isolation pattern 200 may be adjacent to the first surface 100a of the substrate 100. A width of the upper portion 201 of the device isolation pattern 200 may increase as a distance from the second surface 100b increases. The upper portion 201 of the device isolation pattern 200 may be narrower than an intermediate portion 202 of the device isolation pattern 200. The intermediate portion 202 of the device isolation pattern 200 may have the maximum width W2 of the device isolation pattern 200. A width of the lower portion 203 of the device isolation pattern 200 may decrease as a distance from a bottom surface 200b of the device isolation pattern 200 decreases. A width W3 of the bottom surface 200b of the device isolation pattern 200 may be smaller than the maximum width W2 of the intermediate portion 202. In an example embodiment, the upper portion 201 of the device isolation pattern 200 may have a cross section which is convex toward the second surface 100b of the substrate 100, and the lower portion 203 of the device isolation pattern 200 may have a cross section which is convex toward the first surface 100a of the substrate 100. However, the inventive concepts are not limited thereto.

The device isolation pattern 200 may include an insulating layer IL provided on the bottom surface 200b and sidewalls 200s of the device isolation pattern 200. The upper portion 201 of the device isolation pattern 200 may be delimited by or closed with the insulating layer IL. A thickness and a material of the insulating layer IL may be the same as described with reference to FIGS. 2A and 2B. The insulating layer IL may conformally cover the second surface 100b of the substrate 100 and the sidewalls 200s and a bottom surface 200b of the device isolation pattern 200. The thickness of the insulating layer IL disposed on the second surface 100b of the substrate 100 may be substantially equal to that of the insulating layer IL disposed on the sidewalls 200s and the bottom surface 200b of the device isolation pattern 200. As described with reference to FIGS. 2C and 2D, the natural oxide layer 150 may be provided between the insulating layer IL and the substrate 100.

An air gap AG may be provided in the device isolation pattern 200 between the pixel regions UP of the substrate 100 and may be surrounded by the insulating layer IL. The device isolation pattern 200 may have a refractive index lower than that of the substrate 100. For example, a refractive index of the insulating layer IL may be lower than that of the substrate 100, and a refractive index of the air gap AG may be lower than that of the insulating layer IL. Since the insulating layer IL is conformally formed with a relatively thin thickness, a volume ratio of the air gap AG to the device isolation pattern 200 may be increased. As a result, crosstalk between the pixel regions UP may be reduced or prevented.

As described with reference to FIGS. 3A to 3C, a formation process of the device isolation pattern 200 according to the present example embodiment may include the process of forming the trench 250 and the process of forming the insulating layer IL. Forming the trench 250 may include isotropically etching the substrate 100 exposed by the mask pattern. A cross-sectional shape of the trench 250 may correspond to the cross-sectional shape of the device isolation pattern 200. The shallow device isolation layer STI may act as an etch stop layer in the process of forming the trench 250, so a bottom surface of the trench 250 may be in contact with one surface of the shallow device isolation layer STI. In another example embodiment, an etching condition may be adjusted, so the bottom surface of the trench 250 may be spaced apart from the one surface of the shallow device isolation layer STI. The insulating layer IL may be formed on the second surface 100b, and an upper portion of the trench 250 may be delimited by or closed with the insulating layer IL. Thus, the device isolation pattern 200 including the air gap AG may be formed. According to embodiments of the inventive concepts, the upper portion of the trench 250 may be narrower than an intermediate portion of the trench 250, so the upper portion of the trench 250 may be more easily delimited by or closed with the insulating layer IL. In other words, the air gap AG may be more easily formed.

Figure 7A:
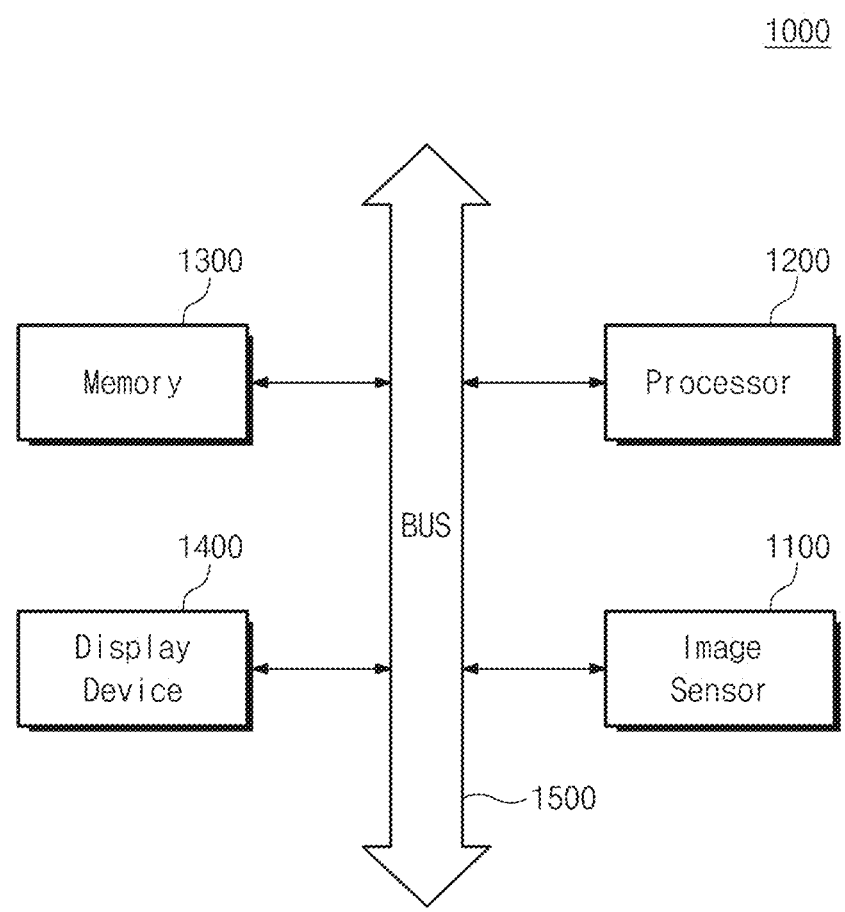
FIG. 7A is a schematic block diagram illustrating a processor-based system including an image sensor according to some example embodiments of the inventive concepts.
Figure 7B:
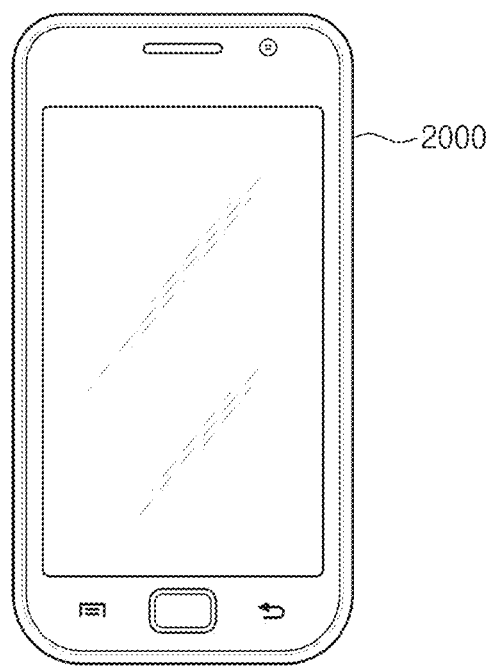
FIG. 7B illustrates an electronic device including an image sensor according to some example embodiments of the inventive concepts.

FIG. 7A is a schematic block diagram illustrating a processor-based system including an image sensor according to example embodiments of the inventive concepts. FIG. 7B illustrates an electronic device including an image sensor according to example embodiments of the inventive concepts. The electronic device may be a digital camera or a mobile device.

Referring to FIG. 7A, a processor-based system 1000 may include an image sensor 1100, a processor 1200, a memory device 1300, a display device 1400, and a system bus 1500. As illustrated in FIG. 7A, the image sensor 1100 may capture external image information in response to control signals of the processor 1200. The processor 1200 may store the captured image information into the memory device 1300 through the system bus 1500. The processor 1200 may display the image information stored in the memory device 1300 on the display device 1400.

The system 1000 may be a computer system, a camera system, a scanner, a mechanized clock system, a navigation system, a video phone, a management system, an auto-focus system, a tracking system, a sensing system, or an image stabilization system. However, the inventive concepts are not limited thereto. If the processor-based system 1000 is applied to the mobile device, the system 100 may further include a battery used to supply an operating voltage to the mobile device.

FIG. 7B illustrates a mobile phone 2000 implemented with the image sensor according to example embodiments of the inventive concepts. In other example embodiments, the image sensor according to example embodiments of the inventive concepts may be applied to a smart phone, a personal digital assistant (PDA), a portable multimedia player (PMP), a digital multimedia broadcast (DMB) device, a global positioning system (GPS) device, a handled gaming console, a portable computer, a web tablet, a wireless phone, a digital music player, a memory card, and/or other electronic products transmitting and/or receiving information by wireless.

According to example embodiments of the inventive concepts, the insulating layer may be disposed on the top surface of the substrate to delimit or close the upper portion of the trench, so the device isolation pattern including the air gap may be formed in the substrate. The width of the trench may decrease as a distance from the top surface of the substrate decreases. The upper portion of the trench may be narrower than the intermediate portion of the trench, and thus, the upper portion of the trench may be more easily delimited by or closed with the insulating layer. As a result, the air gap may be more easily formed in the device isolation pattern. The insulating layer may be conformally formed with a relatively thin thickness, so the volume ratio of the air gap to the device isolation pattern may be increased. In other words, the refractive index of the device isolation pattern may be reduced to reduce or prevent the crosstalk between the pixel regions.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An image sensor comprising:
    a substrate including a plurality of pixel regions that include a first pixel region and a second pixel region;
    a plurality of photoelectric conversion parts including a first photoelectric conversion part disposed in the first pixel region and a second photoelectric conversion part disposed in the second pixel region; and
    a device isolation pattern disposed between the first pixel region and the second pixel region in the substrate,
    wherein a void is disposed in the device isolation pattern,
    wherein a width of an upper portion of the device isolation pattern is less than a width of an intermediate portion of the device isolation pattern, and
    wherein a width of a bottom portion of the device isolation pattern is less than the width of the intermediate portion of the device isolation pattern.

2. The image sensor of claim 1, wherein the device isolation pattern is disposed between the first photoelectric conversion part and the second photoelectric conversion part.

3. The image sensor of claim 1, further comprising a grid pattern disposed on the substrate and vertically overlapping the device isolation pattern,
    wherein a width of the grid pattern is less than the width of the intermediate portion of the device isolation pattern.

4. The image sensor of claim 1, wherein the width of the upper portion of the device isolation pattern at the same level as an upper surface of the substrate is in a range of 30 nm to 250 nm.

5. The image sensor of claim 1, wherein the bottom portion of the device isolation pattern is rounded.

6. The image sensor of claim 1, wherein the device isolation pattern is spaced apart from a lower surface of the substrate.

7. The image sensor of claim 1, wherein the device isolation pattern is disposed in a trench formed between the first pixel region and the second pixel region in the substrate,
    wherein the device isolation pattern includes an insulating layer on inner sidewalls of the trench, and
    wherein the insulating layer includes a silicon-based insulating material and/or a high-k dielectric material.

8. The image sensor of claim 7, wherein the high-k dielectric material includes hafnium oxide and/or aluminum oxide, and
    the silicon-based insulating material includes silicon nitride, silicon oxide, and/or silicon oxynitride.

9. The image sensor of claim 1, wherein the void is vertically long shaped, and
    a vertical length of the void is greater than a horizontal width of the void.

10. An image sensor comprising:
    a substrate including a plurality of pixel regions that include a first pixel region and a second pixel region;
    a plurality of photoelectric conversion parts including a first photoelectric conversion part disposed in the first pixel region and a second photoelectric conversion part disposed in the second pixel region;
    a device isolation pattern disposed between the first photoelectric conversion part and the second photoelectric conversion part in the substrate; and
    a grid pattern disposed on an upper surface of the substrate and vertically overlapping the device isolation pattern,
    wherein a vertically long shaped void is disposed in the device isolation pattern,
    wherein a vertical length of the void is greater than a horizontal width of the void, and
    wherein a width of the grid pattern is less than a maximum width of the device isolation pattern.

11. The image sensor of claim 10, further comprising:
    a transfer gate disposed on a lower surface of the substrate; and
    an interconnection structure disposed on the lower surface of the substrate and covering the transfer gate.

12. The image sensor of claim 10, wherein a width of an upper portion of the device isolation pattern is less than a width of an intermediate portion of the device isolation pattern, and
    wherein a width of a bottom portion of the device isolation pattern is less than the width of the intermediate portion of the device isolation pattern.

13. The image sensor of claim 10, wherein the maximum width of the device isolation pattern is in a range of 200 nm to 300 nm.

14. The image sensor of claim 10, further comprising an anti-reflection layer disposed on the upper surface of the substrate and covering the device isolation pattern.

15. The image sensor of claim 14, further comprising:
    a color filter disposed on the anti-reflection layer; and
    a micro-lens disposed on the color filter.

16. An image sensor comprising:
    a substrate including a plurality of pixel regions that include a first pixel region and a second pixel region;
    a plurality of photoelectric conversion parts including a first photoelectric conversion part disposed in the first pixel region and a second photoelectric conversion part disposed in the second pixel region;
    a device isolation pattern disposed between the first pixel region and the second pixel region in the substrate;
    a transfer gate disposed on a lower surface of the substrate;
    an interconnection structure disposed on the lower surface of the substrate and covering the transfer gate; and
    a grid pattern disposed on an upper surface of the substrate and vertically overlapping the device isolation pattern,
    wherein a vertically long shaped air-gap is disposed in the device isolation pattern,
    wherein a width of an upper portion of the device isolation pattern is less than a width of an intermediate portion of the device isolation pattern,
    wherein a width of a bottom portion of the device isolation pattern is less than the width of the intermediate portion of the device isolation pattern, and
    wherein a width of the grid pattern is less than a maximum width of the device isolation pattern.

17. The image sensor of claim 16, wherein the width of the upper portion of the device isolation pattern at the same level as an upper surface of the substrate is in a range of 30 nm to 250 nm, and
    the maximum width of the device isolation pattern is in a range of 200 nm to 300 nm.

18. The image sensor of claim 16, wherein a vertical length of the air-gap is greater than a horizontal width of the air-gap.

19. The image sensor of claim 16, wherein the device isolation pattern is disposed in a trench formed between the first pixel region and the second pixel region in the substrate,
 wherein the device isolation pattern includes an insulating layer on inner sidewalls of the trench, and
 wherein the insulating layer includes a high-k dielectric material.

20. The image sensor of claim 19, wherein a refractive index of the insulating layer is less than that of the substrate, and is greater than that of the air-gap.

* * * * *